United States Patent [19]

Sato et al.

[11] Patent Number: 5,296,037
[45] Date of Patent: Mar. 22, 1994

[54] PLASMA CVD SYSTEM COMPRISING PLURAL UPPER ELECTRODES

[75] Inventors: Nobuyoshi Sato; Kojiro Sugane, both of Chiba, Japan

[73] Assignee: Kawasaki Steel Corporation, Kyogo, Japan

[21] Appl. No.: 901,764

[22] Filed: Jun. 17, 1992

[30] Foreign Application Priority Data

Jun. 21, 1991 [JP] Japan .................................. 3-150599

[51] Int. Cl.⁵ ............................................. C23C 16/50
[52] U.S. Cl. .................................. 118/723 E; 118/730
[58] Field of Search ............ 118/723, 728, 730, 723 E; 156/345

[56] References Cited

U.S. PATENT DOCUMENTS

| | | | |
|---|---|---|---|
| 4,376,692 | 3/1983 | Tsukada et al. | 156/345 X |
| 4,400,235 | 8/1983 | Coquin et al. | 156/345 X |
| 5,110,438 | 5/1992 | Ohmi et al. | 156/345 X |

FOREIGN PATENT DOCUMENTS

| | | |
|---|---|---|
| 62-172732 | 7/1987 | Japan . |
| 1-211914 | 8/1989 | Japan . |
| 2-76230 | 3/1990 | Japan . |
| 2-105417 | 4/1990 | Japan . |
| 2-105527 | 4/1990 | Japan . |

*Primary Examiner*—Brian E. Hearn
*Assistant Examiner*—Jonathan D. Baskin
*Attorney, Agent, or Firm*—Oliff & Berridge

[57] ABSTRACT

A diode parallel-plate plasma CVD system has semiconductor wafers are mounted with each of the front surfaces thereof being downwardly directed. The plasma CVD system includes an insulating wafer holder and conductive upper electrodes each being adapted to cover back surface of the semiconductor wafer, thereby forming a film to reduce internal stress and improve energy efficiency.

7 Claims, 5 Drawing Sheets

5,296,037

PLASMA CVD SYSTEM COMPRISING PLURAL UPPER ELECTRODES

BACKGROUND OF THE INVENTION

1. Field of the Invention

The present invention relates to a diode parallel-plate plasma CVD system forming a thin film constituting a semiconductor device and a method for producing the semiconductor device using the same.

2. Description of the Related Art

To form a thin film constituting a semiconductor device, a diode parallel-plate plasma CVD system has been used. The plasma CVD system of this type has such a construction wherein wafers are mounted with the surfaces thereof being downwardly directed for reducing particles (for example, as disclosed in Japanese Patent Laid-open No. sho 62-172732).

FIGS. 4a to 4c show a plasma CVD system of the conventional type having the above described structure: FIG. 4a is a side view; FIG. 4b is an enlarged view of the 4(b) portion shown in FIG. 4a; and FIG. 4c is a plan view of a wafer holder.

Referring to FIG. 4a, a reaction gas 8 is fed within a vacuum vessel 10 while an exhaust gas is discharged from gas exhaust ports 4, and thus the degree of vacuum in vessel 10 is kept at several Torr. In such a state, a low frequency power supply (50 KHz) applies a low frequency electric power across a diode parallel-plate type opposed electrodes composed of a wafer holder 2 serving as an upper electrode (ground electrode) and a lower electrode (power supply side electrode) 3, thus generating a plasma 9 therebetween to form a film on each of the wafers 1. In this case, a heater 12 supplies sufficiently stable heat to the back surface of the wafer 1. The heating plays an important role in forming a film having sufficient thickness and the preferable crystal structure on the front surface of the wafer 1.

However, the plasma CVD system mentioned above has a disadvantage in that sticking of the insulating film 11 on the peripheral portion of each wafer 1 often occurs, as shown in FIG. 4b, which makes the film formation slow and unstable. Namely, the insulating film 11, stuck on the peripheral portion of the wafer 1, insulates the wafer 1 from the wafer holder 2 serving as the upper electrode, thus potentially causing a defect in the film formation.

Taking this into consideration, see FIGS. 5a to 5e, which corresponds to the subject matter of Japanese Patent Laid-open hei 2-105527 and which proposes such a technique, i.e., covering the back surface of each wafer 1 mounted on a wafer holder 2 with a conductive material 16, and connecting the conductive material 16 to the wafer holder 2 (upper electrode) thereby securing the stability of the film formation. However, this technique has the following disadvantage. Since the wafer holder 2 serving as the upper electrode has a large area (e.g., a diameter of 700 mm), the use of a high frequency power supply (e.g. 13.56 MHz) allows the current to flow on the front surface of the electrode due to the skin effect or the like, thereby reducing the electric power contributing to film formation. Further, as shown, the electric power for generating plasma is spread across the whole area of the wafer holder 2, which causes the electric power to be dispersed thereby weakening the electric field distribution in the vicinity of each wafer (bringing about the tendency of reducing the plasma density in each wafer region). This lowers the generation amount of plasma in the vicinity of the wafer, which remarkably reduces the film formation rate. Therefore, in practical application, the diode parallel-plate plasma CVD system has used only a low frequency power of approximately 50 KHz.

However, the film formation using a low frequency power supply has the disadvantage of generating a compressive stress as an internal stress within the film, and of enlarging damage to an element due to ions, thereby deteriorating the reliability of the semiconductor device.

SUMMARY OF THE INVENTION

Taking the above into consideration, the object of the present invention is to provide a plasma system capable of generating high density plasma on only each wafer region, and stably forming a film having reduced internal stress while reducing damage to an element due to ions, and a method for producing a semiconductor device wherein a stable film is formed.

To achieve the above object, in a first aspect of the present invention, there is provided a diode parallel-plate plasma CVD system wherein a plurality of semiconductor wafers are mounted with each of the front surfaces thereof formed with an integral circuit being downwardly directed, comprising: an insulating wafer holder having a plurality of openings, on each opening the peripheral portion of the semiconductor wafer is mounted such that the front surface thereof is downwardly exposed; and a plurality of conductive upper electrodes, each being adapted to cover the back surface of the semiconductor wafer mounted on the opening of the wafer holder.

In this case, the material of the upper electrode mentioned above is conductive, but is not limited in the kind thereof. Further, the upper electrode is formed in such a shape as to equalize plasma, generated between each semiconductor wafer and the lower electrode, i.e., in the region between and within each semiconductor wafer, and is not limited but may be preferably formed in such a manner as to cover nearly the whole region of the back surface of the semiconductor wafer, which is made in close-contact therewith for improving the uniformity of film formation with plasma.

Also, the wafer holder is made of such an insulating material as to exert no adverse effect on the semiconductor wafer and is not limited, but preferably includes quartz glass, silicon carbide, ceramic and the like.

Further, there is preferably provided a high frequency power supply for applying a high frequency power of, for example, 13.56 MHz across the grounding upper electrodes and the lower electrode.

In a second aspect of the present invention, there is provided a method for producing a semiconductor device using the above-mentioned plasma CVD system comprising the steps of:

Preparing a diode parallel-plate plasma CVD system having an internal vessel including: an insulating wafer holder having a plurality of openings, on each opening the peripheral portion of each of a plurality of semiconductor wafers is mounted such that the front surface thereof is downwardly exposed, a plurality of conductive upper electrodes, each being adapted to cover the back surface of the semiconductor wafer mounted on the opening, and a lower electrode approximately horizontally spread under the wafer holder;

mounting the semiconductor wafer on the opening such that the front surface thereof is downwardly directed;

bringing the upper electrode in close-contact with the back surface of the semiconductor wafer mounted on the opening; and feeding a reaction gas within the vessel and applying an alternating electric power across the upper electrodes and the lower electrode for generating plasma by reaction of the gas between the upper electrodes and the lower electrode, thereby forming a film on the front surface of the semiconductor wafer.

In a third aspect of the present invention, there is provided a diode parallel-plate plasma CVD system wherein a plurality of semiconductor wafers are mounted with each of the front surfaces thereof to be formed with an integral circuit being downwardly directed, comprising: an insulating wafer holder having a plurality of openings, each opening having a peripheral conductive portion made of a conductive material on which the peripheral portion of the semiconductor wafer is mounted such that the front surface thereof is downwardly exposed; and a plurality of conductive upper electrodes, each being adapted to cover the back surface of the semiconductor wafer mounted on the opening of the wafer holder.

In a fourth aspect of the present invention, there is provided a method for producing a diode parallel-plate plasma CVD system comprising the steps of:

preparing a diode parallel-plate plasma CVD system having an internal vessel including: an insulating wafer holder having a plurality of openings, each opening having a peripheral conductive portion made of a conductor material on which the peripheral portion of the semiconductor wafer is mounted such that the front surface thereof is downwardly exposed; a plurality of conductive upper electrodes, each being adapted to cover the back surface of the semiconductor wafer mounted on the opening; and a lower electrode approximately horizontally spread under the wafer holder;

mounting the semiconductor wafer on the opening such that the front surface thereof is downwardly directed;

bringing the upper electrode in close-contact with the back surface of the semiconductor wafer mounted on the opening; and feeding a reaction gas within the vessel and applying an alternating electric power across the upper electrodes and the lower electrode for generating plasma by reaction of the gas between the upper electrodes and the lower electrode, thereby forming a film on the front surface of the semiconductor wafer.

The plasma CVD system according to the present invention has a structure of providing a wafer holder made of an electrically insulating material (which has conventionally served as an upper electrode), and covering only the peripheral portion of each opening of the wafer holder and the back surface of each semiconductor wafer with a conductive material which serves as each upper electrode, thereby enabling plasma formation only in the region of each semiconductor wafer. This prevents the dispersion of energy supplied from the power supply thus enhancing energy efficiency and relaxing any skin effect or the like. Accordingly, there can be applied a high frequency electric power of, for example, 13.56 MHz, to hence stably form a film having reduced internal stress while reducing damage to an element due to ions.

As described above, in the plasma CVD system of the present invention, a wafer holder is substantially made of an insulating material and the back surface of each semiconductor wafer is covered with each upper electrode. This makes it possible to generate high density plasma only in the region of each semiconductor wafer (i.e., in the vicinity of wafer surface and/or wafer), which causes radical atoms contributing to film formation to be concentrated in the vicinity of the wafer surface, thus enhancing throughput. Further, this makes it possible to apply high frequency electric power because of the relaxed skin effect or the like. As a result, there can be stably formed a film having reduced internal stress while, at the same time, reducing damage to an element due to ions.

BRIEF DESCRIPTION OF THE DRAWINGS

FIG. 1b is an enlarged view of the circled portion 1(b) shown in FIG. 1a;

FIG. 3b is an enlarged view of the circled portion 3(b) shown in FIG. 3a;

FIG. 4b is an enlarged view of the circled portion 4(b) shown in FIG. 4a; and FIGS. 5a to 5c are typical views of another example of a diode parallel-plate CVD system according to the prior art where FIGS. $5b_1$ to $5b_3$ are enlarged views representative of the circled portion 5(b) shown in FIG. 5a.

DESCRIPTION OF THE PREFERRED EMBODIMENTS

Figure 1A:
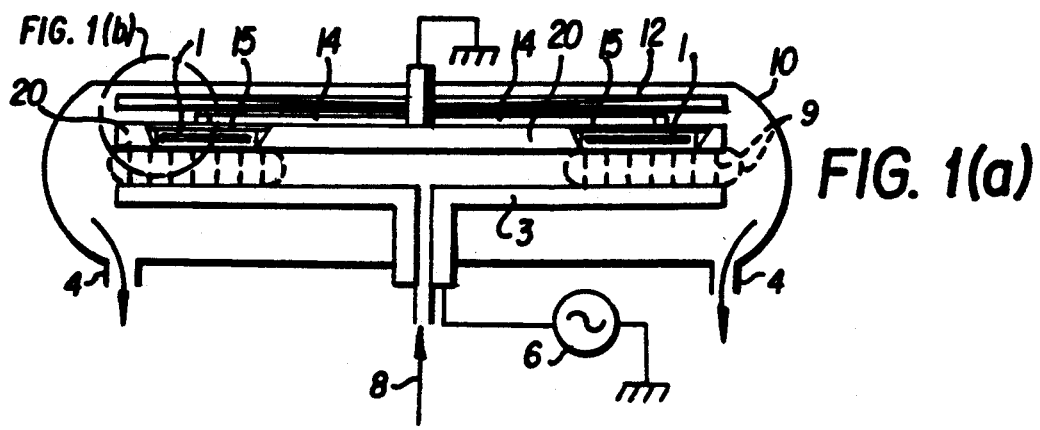
FIGS. 1a to 1c are typical views of one embodiment of a diode parallel-plate plasma CVD system according to the present invention where
Figure 1B:
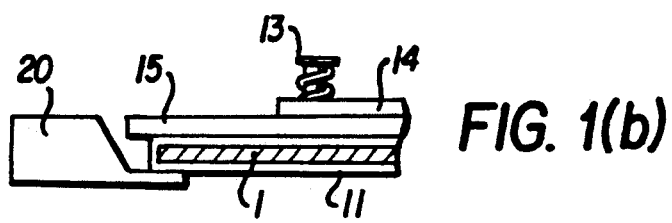
Figure 1C:
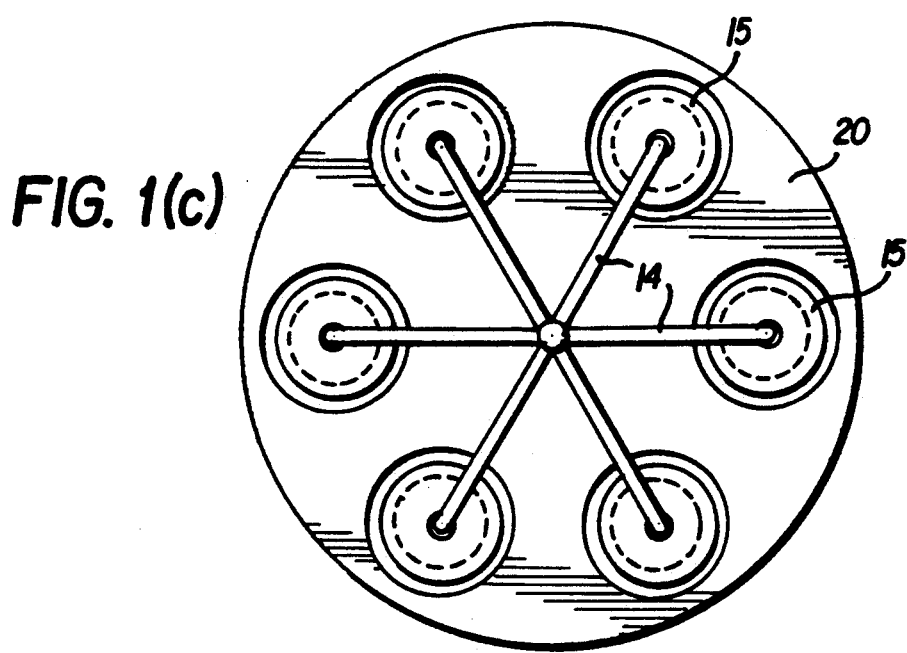

Hereinafter, the embodiments of the present invention will be described in detail with reference to the accompanying drawings:

FIGS. 1a to 1c are typical views of one embodiment of a diode parallel-plate CVD system according to the present invention. In these figures, parts common to those described in the conventional examples (FIGS. 4a to 4c and 5a to 5c) are indicated by the same numerals, and only the different features will be explained.

In this embodiment, a wafer holder 20 is composed of an insulating material such as quartz glass, and each upper electrode 14 is in close-contact with the back surface of each semiconductor wafer 1 and is made of a conductive material. The upper electrode 15 is connected to each conductive upper electrode grounding arm 14 by means of a coil spring 13. The upper electrode grounding arm 14 is grounded to a housing of this system. The coil spring 13 is used to bring the upper electrode 15 in close-contact with the semiconductor wafer 1. Further, 13.56 MHz of a high frequency power supply 6 is provided between the housing (upper electrode) and a lower electrode 3.

In the conventional plasma CVD system, the wafer holder for supporting the wafers serves as the upper electrode, thereby dispersing the electric power for generating plasma in the whole region of the wafer holder, and bringing about the skin effect or the like.

This drastically reduces the energy efficiency during film formation on the semiconductor wafer, and deteriorates throughput because of the reduced film formation rate. Further, this tendency is increased with an increase in power supply frequency. Therefore, it has been difficult to put into practice a diode parallel-plate CVD system using a high frequency power supply of 13.56 MHz for the purpose of reducing the film formation stress without causing damage to an element due to ions.

Conversely, the diode parallel-plate CVD system according to the present invention has a construction wherein the wafer holder is substantially made of an electrically insulating material, the back surface of the semiconductor wafer is covered with a conductive material having a shape and size similar to that of the semiconductor wafer and the conductive material is connected to a grounding part, thereby generating high density plasma on only the region of each semiconductor wafer with the conductive material serving as an upper electrode. With this construction, current is not allowed to flow across the whole region of the wafer holder, thereby relaxing the skin effect or the like to resultantly improve the energy efficiency of the film formation on the semiconductor wafer surface. Further, by bringing the conductive material, which is excellent in thermal transmission, into contact with the back surface of the semiconductor wafer, it is possible to supply heat from a heat supply to the semiconductor wafer stably and uniformly.

The tests of forming a silicon nitride film, for example, were conducted using a plasma CVD working system of the present invention as shown in FIGS. 1a to 1c and a conventional plasma system as shown in FIGS. 4a to 4c and 5a to 5c. The results are shown in a Table 1.

| Performance comparison | CVD SYSTEM | | | |
| --- | --- | --- | --- | --- |
| | Working system 13.56 MHz | Conventional system (1) 50 KHz | Conventional system (2) 13.56 MHz | Conventional system (2) 50 KHz |
| Film formation rate (Å/min) | 360 | 260 | 60 | 360 |
| Film thickness distribution between wafers (%) | ±3 | ±18 | ±10 | ±3 |
| Film stress (dyn/cm$^2$) | 1 × 10$^9$ | 7 × 10$^9$ | 1 × 10$^9$ | 7 × 10$^9$ |
| 1:10 BHF etching rate (Å/min) | 200 | 300 | 200 | 300 |

Figure 4A:
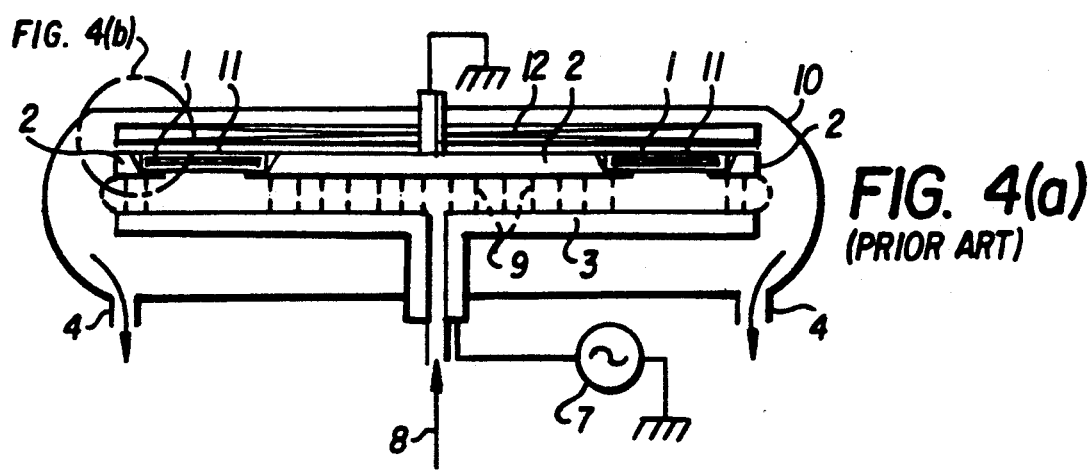
FIGS. 4a to 4c are typical views of one example of a diode parallel-plate plasma CVD system according to the prior art where
Figure 4B:
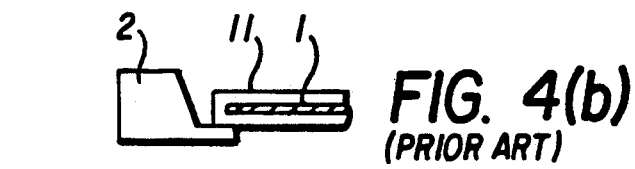
Figure 4C:
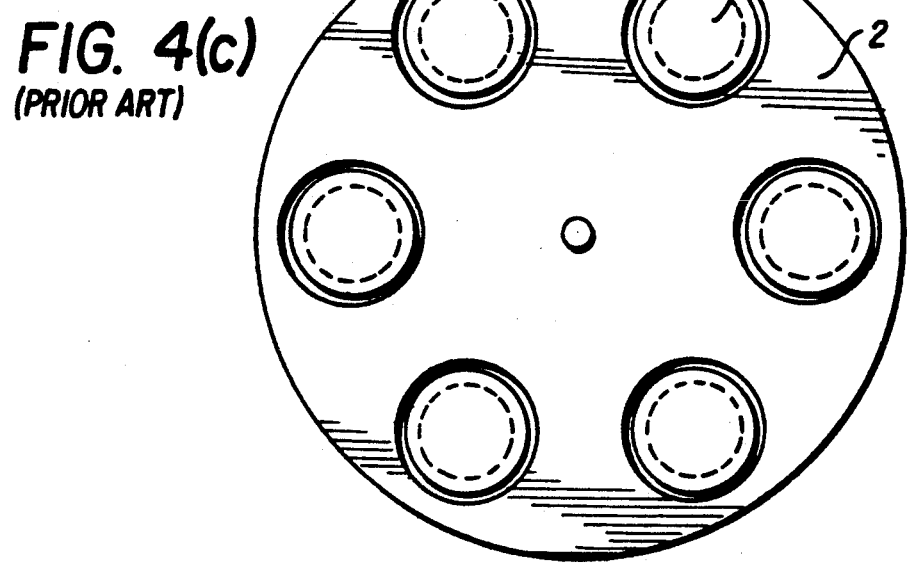
Figure 5A:
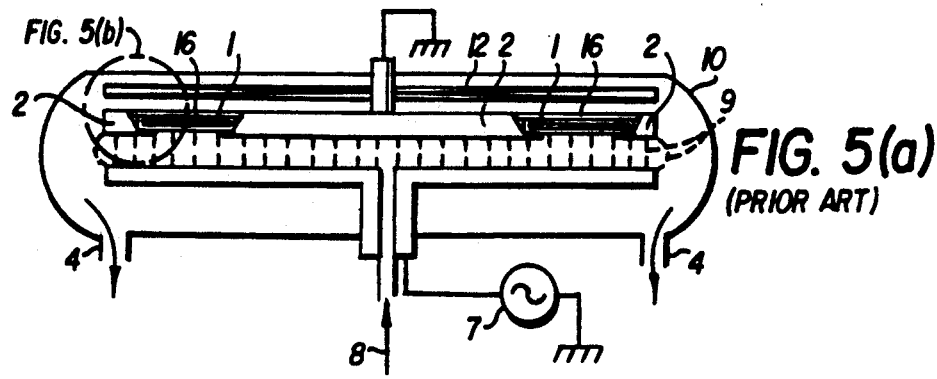
Figure 5:
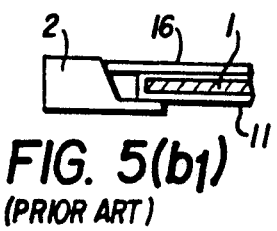
Figure 5:
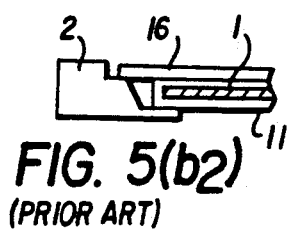
Figure 5:
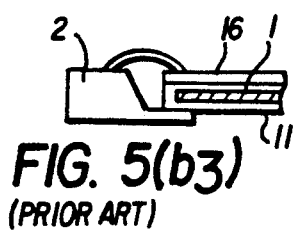
Figure 5C:
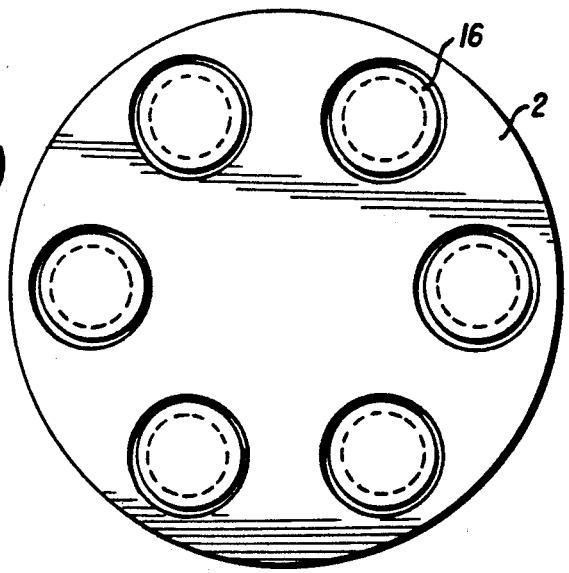

*Each value denotes an average of the values measured in the tests 10 times repeated.

i) In the working system shown in FIGS. 1a to 1c, a high frequency power supply (13.56 MHz) was used. The obtained film (film formation time, 1000 sec.) shows the following film characteristics: average film thickness, approximately 6000 Å ( film formation rate 360 Å/min.); film thickness distribution between semiconductor wafers, ±3%; and film stress, 1×10$^9$ dyn/cm$^2$.

ii) In the conventional system (1) shown in FIGS. 4a to 4c, a low frequency power supply (50 KHz) was used. The obtained film shows the following film characteristics: film formation rate, 260 Å/min.; film thickness distribution between wafers, ±18%; and film stress, 7×10$^9$ dyn/cm$^2$. Thus, this system is inferior to the working system in the film formation aspect.

iii) In the conventional system (2), as shown in FIGS. 5a to 5c, using a high frequency power supply (13.56 MHz), the obtained film (film formation time, 1000 sec.) shows the following film characteristics: average film thickness, approximately 1000 Å ( film formation rate, 60 Å/min.); and film thickness distribution between wafers, ±10%. This system is also inferior to the working system in the film formation aspect.

iv) In the conventional system (2), as shown in FIGS. 5a to 5c, using a low frequency power supply (50 KHz), the obtained film shows the following film characteristics: film formation rate, 360 Å/min.; film thickness distribution between wafers, ±3%; and film stress, 7×10$^9$ dyn/cm$^2$. In this system, the film formation rate and the film thickness between the wafers are improved up to a grade similar to those encountered in the working system; but the film stress is inconveniently larger than that obtained in the working system.

Incidentally, in the case of using a high frequency power supply (13.56 MHz), the etching rate is 200 Å/min. It is smaller than the etching rate (300 Å/min.) in the case of a low frequency power supply (50 KHz). This is because there is formed a film having a more dense crystal structure in the case of the high frequency power supply (13.56 KHz).

Figure 2:
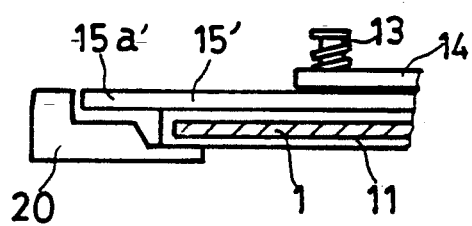
FIG. 2 is a typical view of another embodiment of a diode parallel-plate plasma CVD system according to the present invention.

FIG. 2 is a typical view of another embodiment of the diode parallel-plate plasma CVD system according to the present invention, wherein there is shown only the individual part equivalent to FIG. 1b. Each upper electrode 15' in this embodiment has a peripheral portion 15a' extending beyond a semiconductor wafer 1. This equalizes the plasma existing over the surface of the semiconductor wafer 1 which makes it possible to form more uniform film on the surface of the semiconductor wafer 1. However, when the upper electrode is excessively extended, the power is dispersed, that is, the power per unit area is reduced. Accordingly, for a semiconductor wafer having a diameter of 6 inches, there is preferably used an upper electrode having a diameter of approximately 8 inches or less.

Figure 3A:
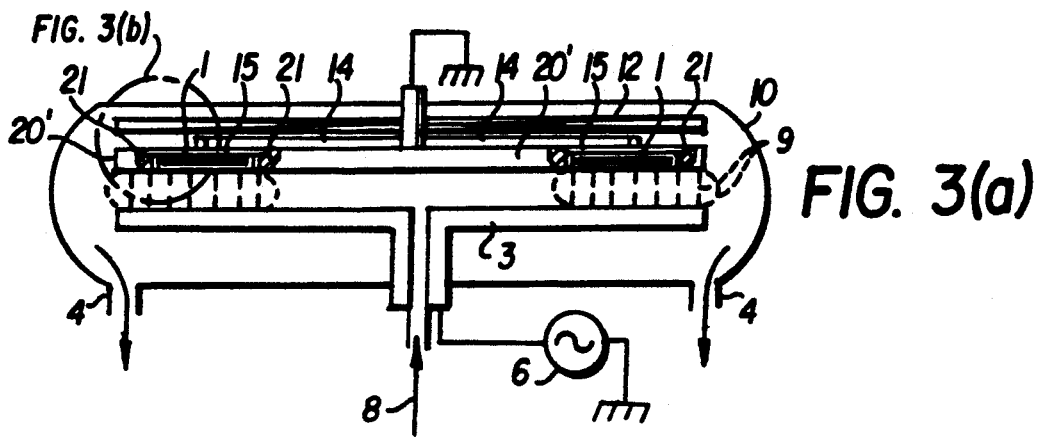
FIGS. 3a to 3c are typical views of a further embodiment of a diode parallel-plate plasma CVD system according to the present invention where
Figure 3B:
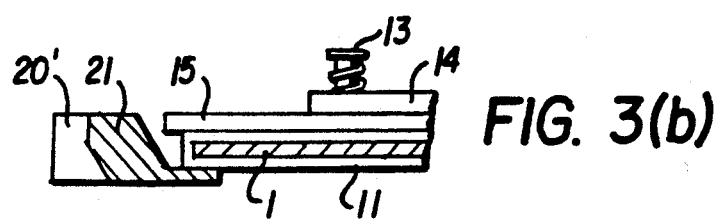
Figure 3C:
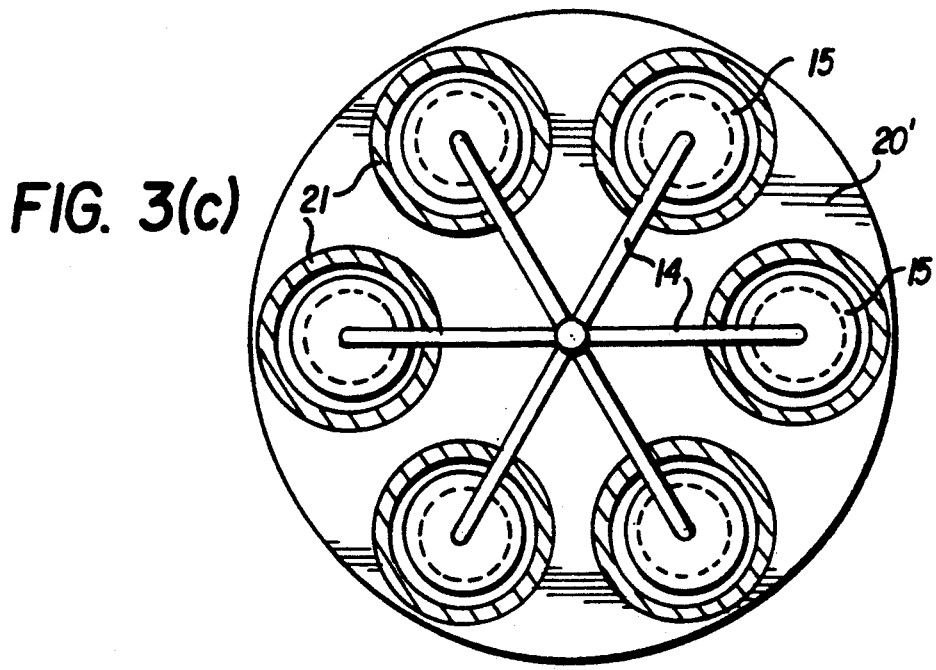

FIGS. 3a to 3c are typical views of a further embodiment of a diode parallel-plate plasma CVD system according to the present invention. In these figures, parts common to those in the embodiment (FIGS. 1a to 1c) described previously are indicated at the same numerals and only the different points will be explained.

A wafer holder 20' in this embodiment is substantially made of an insulating material such as quartz glass, similarly to the embodiment shown in FIGS. 1a to 1c, and the only peripheral portions of each opening on which each semiconductor wafer 1 is mounted is made of a conductive material 21. The conductive material 21 serves as a part of an upper electrode 15. As shown in this embodiment, the wafer holder 20' is not necessarily made of the insulating material as a whole, but may have a peripheral portion made of a conductive material. With this construction, there can be formed a more uniform film, similar to the embodiment shown in FIG. 2.

What is claimed is:

1. A diode parallel-plate plasma CVD system, wherein a plurality of semiconductor wafers, each with front and back surfaces, are mounted with said front surface of each semiconductor wafer having formed thereon an integral circuit, comprising:

an insulating wafer holder having a plurality of openings, each opening having a peripheral portion on which one of said semiconductor wafers is mounted such that the front surface of said semiconductor wafer is exposed; and a plurality of conductive upper electrodes facing the back surfaces of the semiconductor wafers, each upper electrode being located only in a region of a corresponding one of said semiconductor wafers mounted on each of said openings of said insulating wafer holder to form a plasma only in the region of the semiconductor wafers.

2. A plasma CVD system according to claim 1, wherein each of said upper electrodes covers an entire area of said back surface of the corresponding semiconductor wafer.

3. A plasma CVD system according to claim 1, wherein each of said upper electrodes is extended beyond said back surface of the corresponding semiconductor wafer to cover the peripheral portions of the openings.

4. A plasma CVD system according to claim 1, wherein each of said upper electrodes is brought in close-contact with said back surface of each semiconductor wafer.

5. A plasma CVD system according to claim 1, wherein said wafer holder is made of quarts glass, silicon carbide, or a ceramic material.

6. A plasma CVD system according to claim 1, wherein each of said upper electrodes is grounded, and a high frequency power supply is provided for applying a high frequency electric power across said upper electrode and a lower electrode.

7. A diode parallel-plate plasma CVD system, wherein a plurality of semiconductor wafers, each with front and back surfaces, are mounted with each of the front surfaces having formed thereon an integral circuit, comprising:

an insulating wafer holder having a plurality of openings, each opening having a peripheral conductive portion on which a peripheral portion of each semiconductor wafer is mounted such that the front surface of said semiconductor wafer is exposed, and a plurality of conductive upper electrodes facing the back surfaces of the semiconductor wafers, each upper electrode being located only in a region of a corresponding back surface of each semiconductor wafer mounted on each of said openings of said insulating wafer holder to form a plasma only in the region of the semiconductor wafers.

* * * * *